United States Patent
Ong

[19]

[11] Patent Number: 5,919,269
[45] Date of Patent: *Jul. 6, 1999

[54] SUPERVOLTAGE DETECTION CIRCUIT HAVING A MULTI-LEVEL REFERENCE VOLTAGE

[75] Inventor: Adrian E. Ong, San Jose, Calif.

[73] Assignee: Micron Technology, Inc., Boise, Id.

[ * ] Notice: This patent is subject to a terminal disclaimer.

[21] Appl. No.: 09/067,254

[22] Filed: Apr. 27, 1998

Related U.S. Application Data

[63] Continuation of application No. 08/540,915, Oct. 11, 1995, Pat. No. 5,745,499.

[51] Int. Cl.⁶ .................................................. G01R 31/28
[52] U.S. Cl. ........................................... 714/721; 324/765
[58] Field of Search ................................. 371/21.4, 21.2, 371/22.35, 22.5, 25.1, 27.5, 28, 21.1, 21.3; 365/201; 327/546, 525; 324/765; 395/183.06, 183.18, 183.12; 364/489

[56] References Cited

U.S. PATENT DOCUMENTS

| | | | |
|---|---|---|---|
| 5,155,704 | 10/1992 | Walther et al. | 365/201 |
| 5,212,442 | 5/1993 | O'Toole et al. | 324/158 R |
| 5,245,522 | 9/1993 | Kawaguchi et al. | 363/37 |
| 5,260,646 | 11/1993 | Ong | 323/349 |
| 5,283,762 | 2/1994 | Fujishima | 365/189.09 |
| 5,311,481 | 5/1994 | Casper et al. | 365/230.06 |
| 5,349,559 | 9/1994 | Park et al. | 365/201 |
| 5,448,199 | 9/1995 | Park | 327/546 |
| 5,452,253 | 9/1995 | Choi | 365/201 |
| 5,465,232 | 11/1995 | Ong et al. | 365/189 |
| 5,493,532 | 2/1996 | McClure | 365/201 |
| 5,497,117 | 3/1996 | Nakajima et al. | 327/404 |
| 5,532,618 | 7/1996 | Hardee et al. | 326/63 |
| 5,731,720 | 3/1998 | Suzuki et al. | 327/77 |
| 5,745,499 | 4/1998 | Ong | 371/21.4 |

*Primary Examiner*—Robert W. Beausoliel, Jr.
*Attorney, Agent, or Firm*—Schwegman, Lundberg, Woessner & Kluth P.A.

[57] ABSTRACT

An integrated memory circuit is described which can be tested using both a burn-in test and an application specific test. The application specific test is initiated by providing a supervoltage on one of the integrated memory circuit external input pins. A reference voltage circuit is described for producing a variable or multi-level reference voltage used by a supervoltage detection circuit. If a burn-in test is being performed, the reference voltage is adjusted from a level used when the memory is not operating in a burn-in test mode. A multi-level reference voltage is provided to the supervoltage detection circuit, thereby, adjusting the supervoltage level needed to initiate an application specific test.

29 Claims, 4 Drawing Sheets

SUPERVOLTAGE DETECTION CIRCUIT HAVING A MULTI-LEVEL REFERENCE VOLTAGE

CROSS REFERENCE TO RELATED APPLICATION

This application is a continuation of application Ser. No. 08/540,915, U.S. Pat. No. 5,745,499 filed Oct. 11, 1995, which is incorporated herein by reference.

TECHNICAL FIELD OF THE INVENTION

The present invention relates generally to integrated circuit memories and in particular the present invention relates to supervoltage detection circuits in integrated circuit memories.

BACKGROUND OF THE INVENTION

Integrated circuits, as with any manufactured product, are susceptible to defects. These defects can often be identified through 'burn-in' testing conducted at specification extremes. This testing assists in identifying infant failures by forcing the integrated circuit to operate at temperature and voltage extremes.

Alternate testing can be conducted on an integrated circuit to test application specific features. These can be tests conducted at both normal operating voltages and burn-in level voltages. Further, these alternate tests are typically conducted by the manufacture and not intended to be used by a purchaser of the integrated circuit. As such, an electronic key is typically provided to allow the manufacture to initiate an application specific test mode. In integrated memory circuits one of the external input pins is typically used to access the ken. By placing a voltage on the input pin which is a predetermined level above the maximum specified supply voltage, the memory circuit enters a specific test mode. This voltage level is referred to as a supervoltage. A supervoltage detector circuit is, therefore, provided to detect when a supervoltage is presented on the external input pin.

Consumer demand for memory circuits having increased memory capacity has created a generation of memory circuits which operate at supply voltages as low 3.3 volts. These memory circuits have an increased density and due to fabrication constraints have a lower breakdown voltage level than prior 5 volt memories. A problem occurs when a memory circuit is being burn-in tested and an application specific test is initiated. To conduct a burn-in test the supply voltage is raised to an upper voltage limit. To initiate a specific test, a supervoltage which is a predetermined voltage level above the supply voltage must be provided. During burn-in testing this supervoltage level is often above the breakdown voltage for a 3.3 volt memory. As known to those skilled in the art, exceeding the breakdown level of a memory device can be catastrophic and defeat the purpose of burn-in testing.

For the reasons stated above, and for other reasons stated below which will become apparent to those skilled in the art upon reading and understanding the present specification, there is a need in the art for a low voltage memory circuit which can be operated in an application specific test mode during burn-in testing without exceeding breakdown voltage levels.

SUMMARY OF THE INVENTION

The above mentioned problems with integrated circuits and other problems are addressed by the present invention and which will be understood by reading and studying the following specification. An integrated circuit is described which has a supervoltage reference circuit that adjusts a supervoltage reference level.

In particular, the present invention describes an integrated circuit comprising an external input, a supervoltage reference circuit for generating a reference voltage in response to a test mode signal, and a supervoltage detector circuit connected to the external input and the supervoltage reference circuit for detecting a supervoltage provided on the external input. The supervoltage can be a predetermined level above the reference voltage. In one embodiment, the supervoltage reference circuit generates a first reference voltage in response to an active test mode signal, and a second reference voltage in response to an inactive test mode signal. The first reference voltage can be one half of the integrated circuit's supply voltage level and the second reference voltage is equal to the supply voltage level.

In another embodiment, an integrated memory circuit is described which comprises an external input, and a test mode detector circuit for producing a test mode signal in response to a burn-in test. The memory circuit also comprises a supervoltage reference circuit for generating first and second reference voltages in response to the test mode signal, and a supervoltage detector circuit connected to the external input and the supervoltage reference circuit for detecting a supervoltage a predetermined level in excess of the reference voltages and provided on the external input.

In yet another embodiment, a method of detecting a supervoltage in a memory circuit is described. The method comprises the steps of generating a test mode signal in response to an operating state of the memory circuit, generating a reference voltage based upon the test mode signal, and triggering a detection circuit if a voltage received on an external input exceeds the reference voltage by a predetermined level. The method can further include the steps of generating a first reference voltage if the test mode signal is active, and generating a second reference voltage if the test mode signal is inactive.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
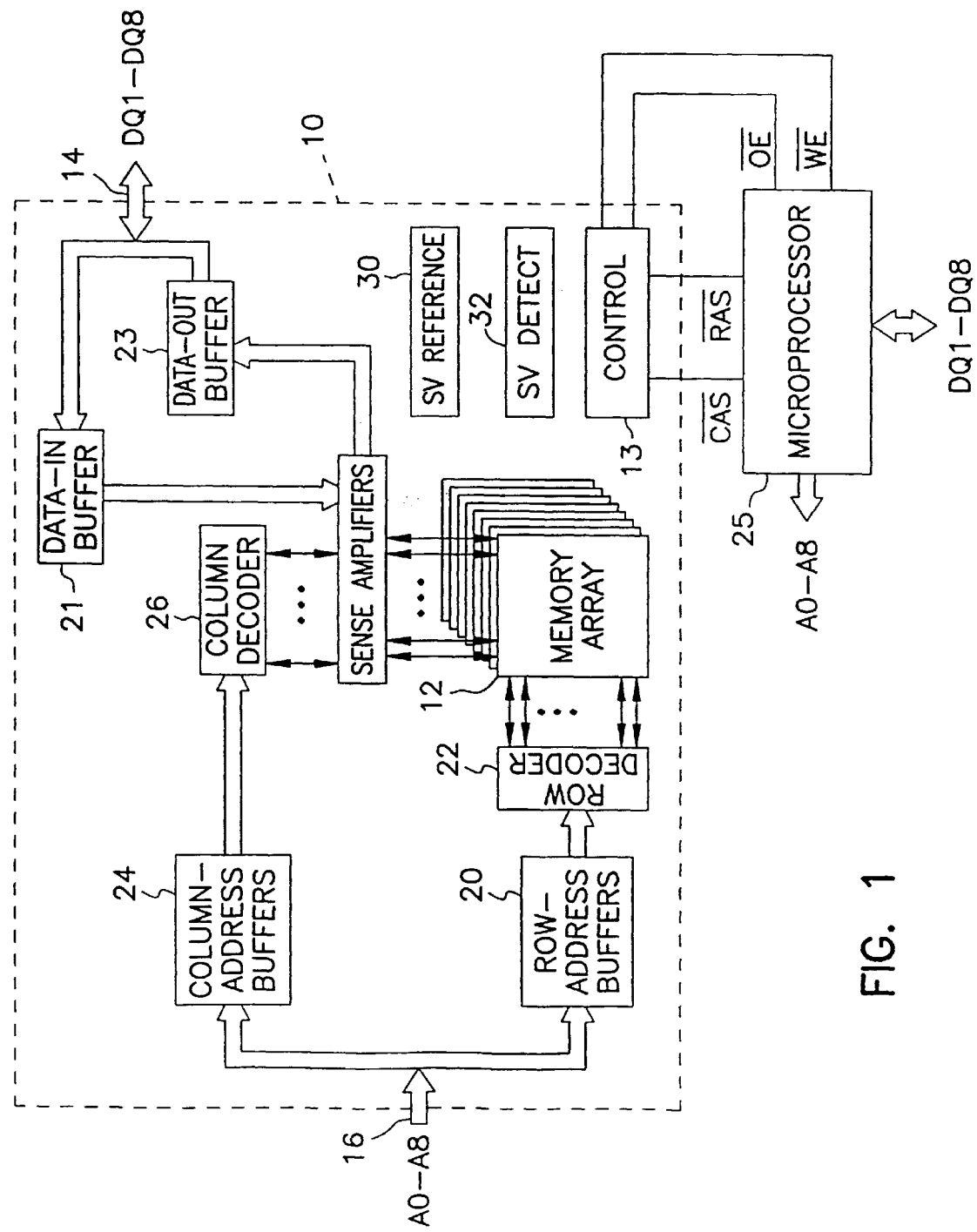
FIG. 1 is an integrated memory circuit incorporating the features of the present invention.

FIG. 1 illustrates a block diagram of a DRAM 10 incorporating the present invention. Detailed elements of portions of the memory have been left out of the figure to focus on the features more directly relevant to the present invention. Such omitted detailed elements of the operation of DRAMs and their applications are known to one skilled in the art. While a DRAM is illustrated, the functions and methods described below are equally applicable to types of memory devices, including but not limited to multi-port memories, synchronous dynamic random access memories (SDRAM) and static random access memories (SRAM).

The DRAM 10 of FIG. 1 includes a DRAM array 12 which can be accessed by a microprocessor 25 through input/output connections including address lines A0–A8. In the embodiment described, the DRAM array 12 is a 512 by 512 by 8 bit array; however, the array may be any other configuration. The DRAM array 12 has a plurality of memory registers, each memory register including eight dynamic memory cells. More specifically, the DRAM array 12 includes rows and columns of eight-bit randomly addressable memory registers, with each cell of the memory register being in a different plane of the array 12. In other words, each eight-bit memory register is made up of memory cells from the eight planes having the same row and column addresses, thus forming addressable rows and columns of eight-bit memory registers.

The DRAM 12 is accessed through address bus 16, row and column address strobe signals RAS* and CAS*, write enable signal WE*, an output enable signal OE* and by using other conventional control signals (not shown) which are known to one skilled in the art. Row address latch/buffer 20 and row decoder 22 receive and decode a row address from a row address signal provided on address lines A0–A8, and address a corresponding row of the DRAM array 12. Likewise, column address latch/buffer 24 and column decoder 26 receive and decode a column address from a column address signal provided on address lines A0–A8, and address the corresponding column of the DRAM array 12.

Data bus 14 receives memory register data during a write cycle from the microprocessor 25 for writing to DRAM array 12. Data stored in the DRAM 12 can be transferred during a read cycle on bus 14. Control logic 13 is used to control the many available functions of the DRAM. Various control circuits and signals not detailed herein initiate and synchronize the DRAM operation as known to those skilled in the art.

Some of the inputs and outputs of DRAM 10 used to communicate with microprocessor 25 are described as follows. Write enable input (WE*) is used to select a read or write cycle when accessing the DRAM. To read the DRAM array, the WE* line is high when CAS* falls. If the WE* line is low when CAS* falls, the DRAM is written to. Row address strobe (RAS*) input is used to clock in the nine row address bits and strobe for WE*, CAS*, and DQ. In standard memories, the RAS* also acts as the master chip enable and must fall for the initiation of any DRAM array or transfer operation. Column address strobe (CAS*) input is used to clock in the nine column address bits.

Address input lines A0–A8 are used to identify a row and column address to select at least one eight-bit word or memory register out of the available memory registers of DRAM array 12, as described above. DRAM data input/output lines DQ1–DQ8 provide data input and output for the DRAM array 12. As stated above, the DRAM description has been simplified for purposes of illustrating the present invention and is not intended to be a complete description of all the features of a DRAM.

Supervoltage Circuitry

It is beneficial to test integrated circuit memories both at specification limits and under application specific operating conditions. Two different types of tests are, therefore, conducted on manufactured memory circuits. The first type of test is a burn-in test which is conducted at specification extremes, including voltage and temperature. For example, a 3.3 volt memory circuit may be specified as operating at a maximum supply voltage of 6 volts. The other type of test is application specific and can include a range of different operational tests. In a memory circuit, such as DRAM 10 shown in FIG. 1, one of the address inputs, for example A7, can be used to activate a test mode. Supervoltage detection circuitry 32 is provided and coupled to address input A7. When a supervoltage is detected on A7 the memory enters a test mode. A series of different test can be included in a memory circuit by using the remaining address inputs for inputting a test identifier.

Traditional supervoltage detector circuits compare the supervoltage input signal to a trip level, which is a predetermined level above the currently used supply voltage. For example, if the memory circuit were a nominal 5 volt device, the supervoltage trip level may be 3 volts above the supply voltage (8 volts). When the device is tested under a burn-in condition of 7 volts, the supervoltage trip level would change to 10 volts.

As a result of increased memory density and changes in fabrication, the supply voltage used for current memory circuits has been reduced to 3.3 volts. Although the memory circuits are designed to be tolerant of higher supply voltages, for example 6 volts, voltage levels substantially above this upper limit can result in damage to the circuitry. The use of a traditional detector circuitry, therefore, would result in damage to the part by requiring a supervoltage of 9 volts during burn-in testing.

Supervoltage reference circuit 30 is provided in memory circuit 10 to adjust a supervoltage reference level if the memory is being tested in a burn-in manner. That is, when a burn-in test is being conducted, the supervoltage reference level is lowered such that a variable reference level, therefore, is used to trigger the supervoltage detector circuit. The differential between the supply voltage and the supervoltage is reduced.

Figure 2:
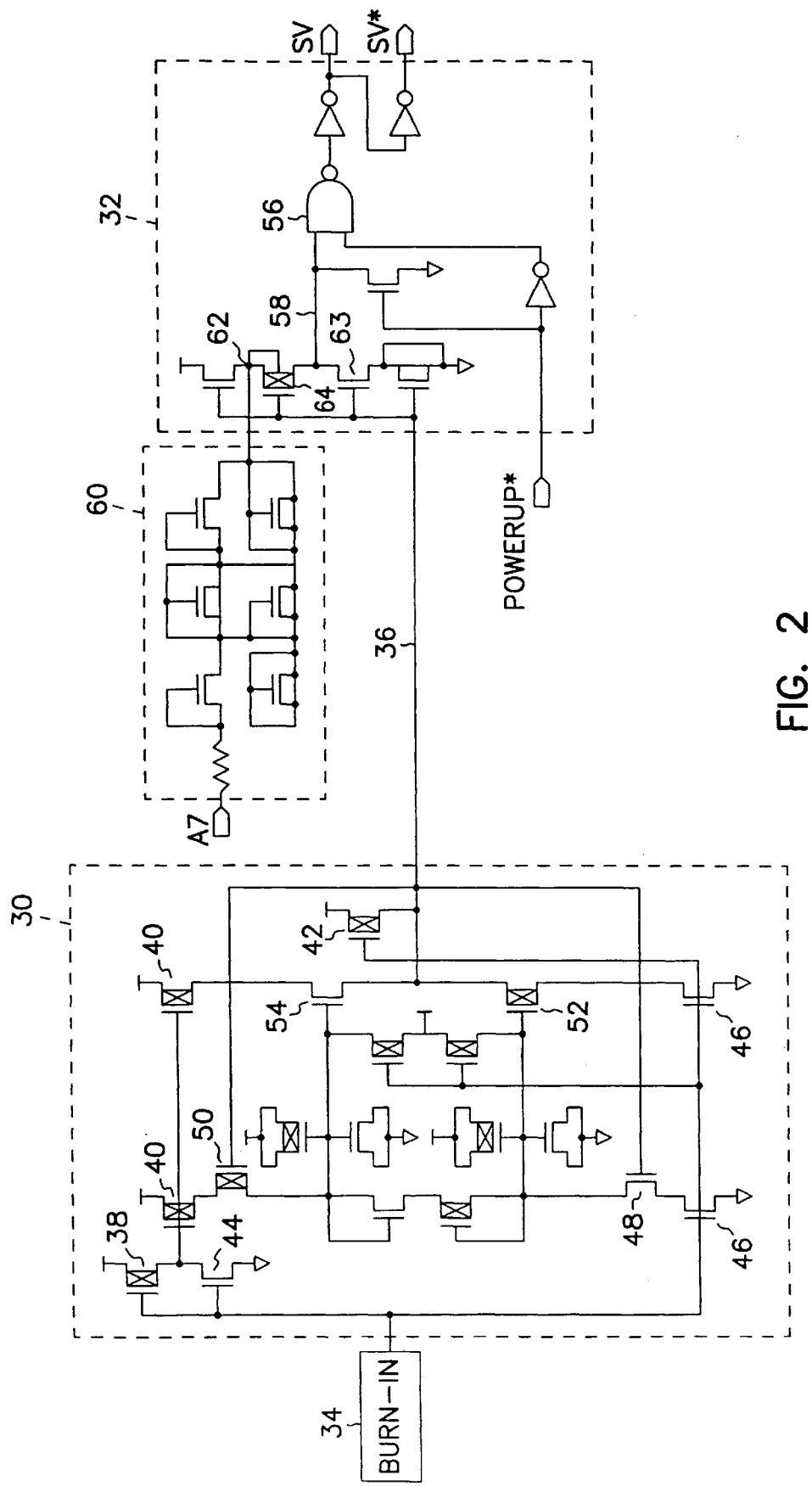
FIG. 2 is a schematic diagram of circuitry included in the memory circuit of FIG. 1.

The supervoltage reference circuit 30 is shown in detail in FIG. 2. An active high signal is provided from burn-in circuit 34 to indicate when the memory circuit is in a burn-in test mode. The burn-in circuit preferably detects a burn-in test by monitoring the supply voltage. If the supply voltage reaches a predetermined upper limit, the burn-in circuit provides a high output. A supervoltage reference signal is provided on node 36 in response to the burn-in circuit. This signal is normally equal to the supply voltage when the device is not operating in burn-in. When the device is operating in a burn-in condition, the reference signal is reduced to one-half (½) the supply voltage. Pull-up transistor 42 is activated when the burn-in signal is low. When the burn-in signal goes high to indicate that a burn-in test is being performed, transistors 40, 44 and 46 are activated. Feed back transistors 48 and 50 in combination with transistors 52 and 54 balance the reference level output 36 of the supervoltage reference circuit 30 to one-half Vcc. The supervoltage reference level, therefore, changes in response to a burn-in test mode.

Supervoltage detector circuit 32, as shown in FIG. 2, receives the reference voltage 36 and detects a supervoltage provided on external address pin A7. A supervoltage signal (SV) and its complement (SV*) are provided as outputs from the detector circuit. A powerup* signal can be used to latch SV low until the memory circuit has been initially powered up to an appropriate supply level. NAND gate 56 will be latched when Powerup* is high and will follow the inverse of node 58 when powerup* is low. The BURN-In signal will activate when Vcc is at a designated burn-in voltage, e.g. 5.5 volts.

Figure 3:
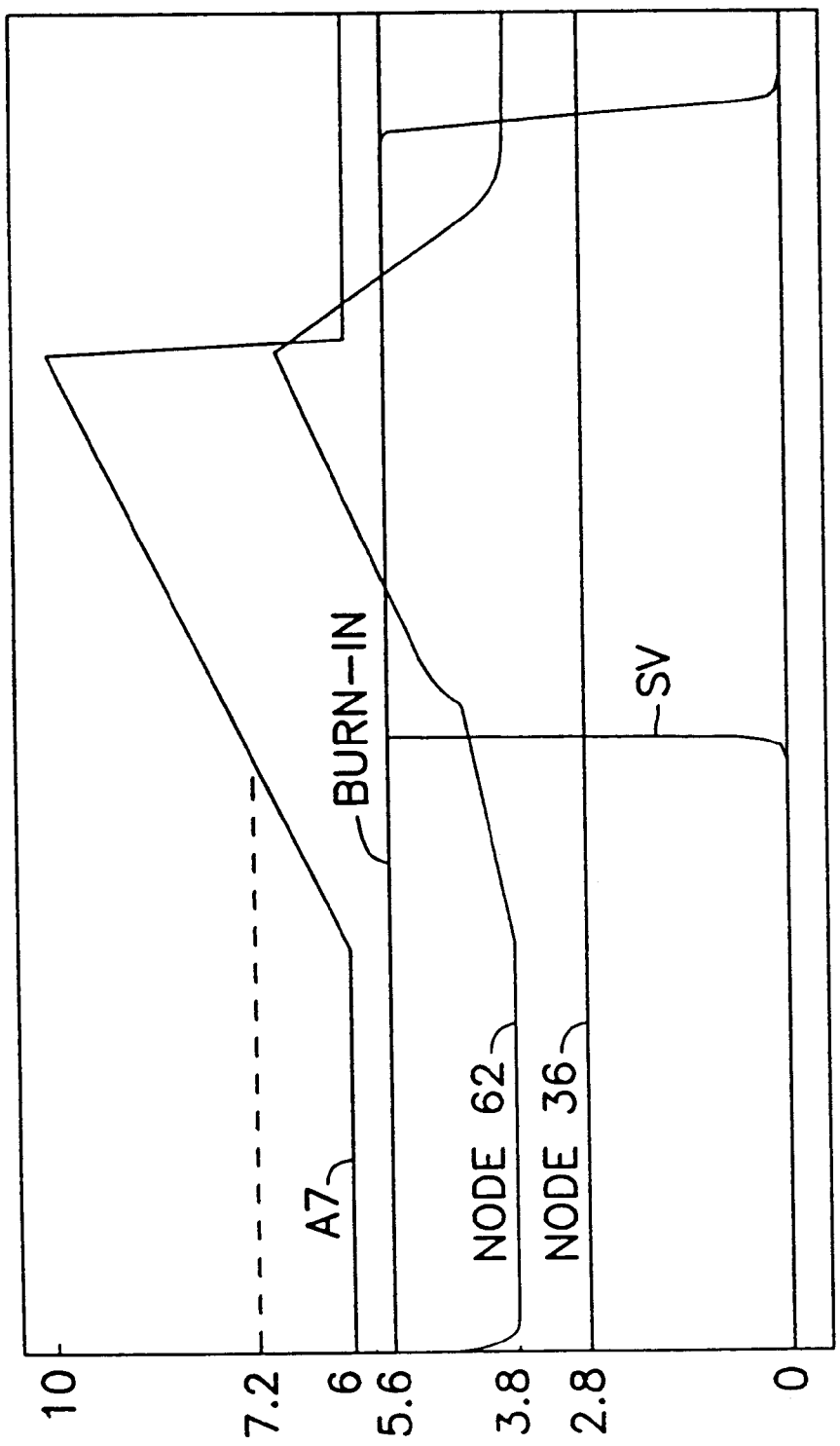
FIG. 3 is a graph of the operation of the circuitry of FIG. 2.
Figure 4:
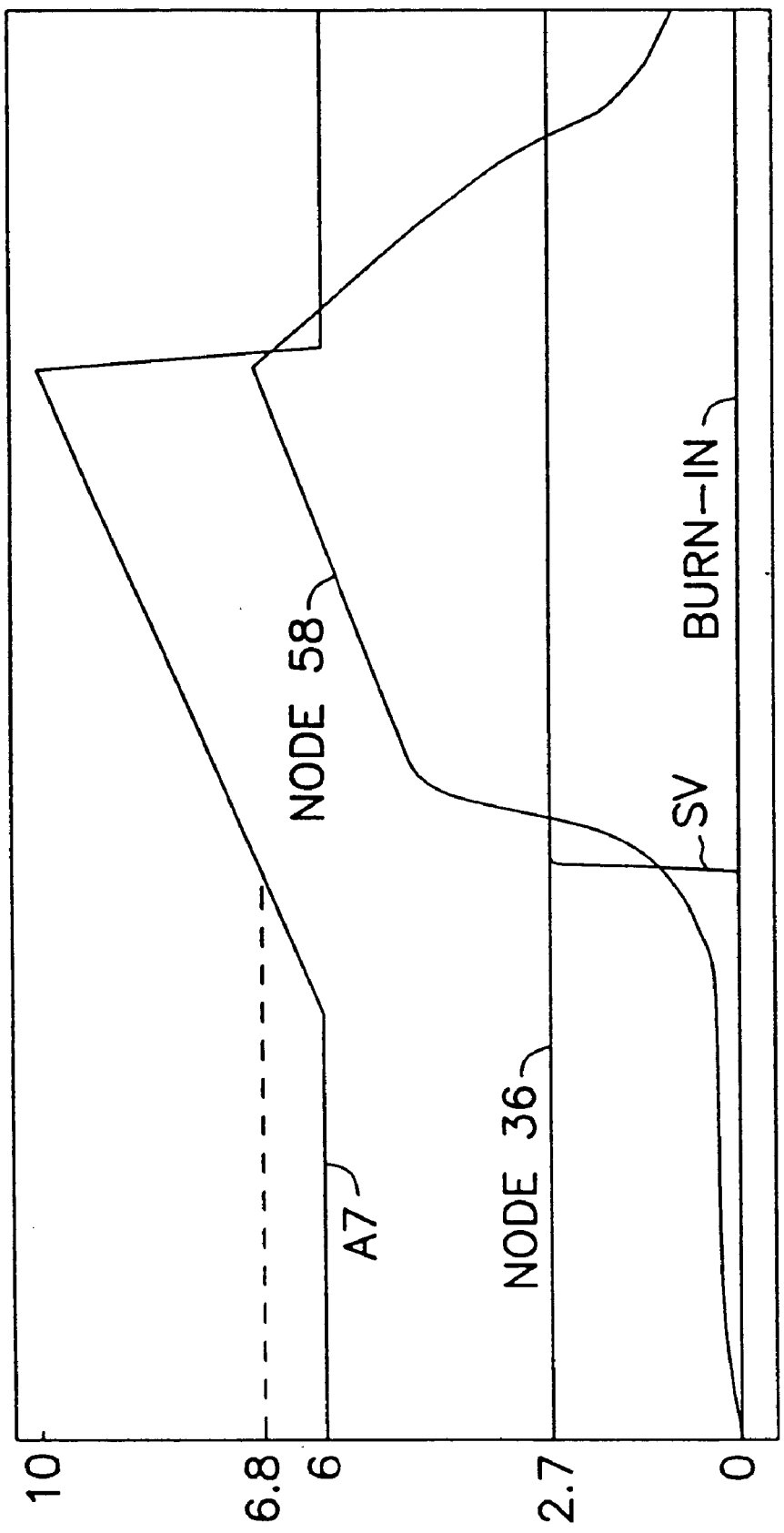
FIG. 4 is another graph of the operation of the circuitry of FIG. 2.

To fully understand the reference circuit 30 and detector circuit 32 reference is made to the diagrams of FIGS. 3 and 4, voltage is shown on the Y-axis and time is platted on the X-axis. FIG. 3 illustrates the reference circuit and detector circuit operations when a burn-in mode is activated. The voltage provided on address pin A7 is tolerant of a voltage higher than the supply voltage, but circuit 60 will scale the voltage level down for use in the detector circuit. With the burn-in signal equal to Vcc (5.6 volts), the supervoltage reference level 36 is approximately Vcc/2. As the voltage on node 62 exceeds the reference voltage (node 36) by a threshold voltage, transistor 64 will begin to turn on. When a sufficient voltage (approximately 4.2 volts) is reached, node 58 is pulled to a high level. SV will goes high in response to NAND gate 56. The voltage on the external address pin, therefore, triggered the supervoltage at 7.2 volts. The actual trip level, for the detection circuit, however, is much lower.

FIG. 4 illustrates the operation of the reference circuit 30 and the detector circuit 32 under normal operating conditions. The Burn-in signal is low and the reference voltage is equal to a nominal Vcc (2.7 volts). As explained above, transistor 64 will begin to turn on when node 62 is a threshold voltage above the reference voltage. When a sufficient voltage is reached, node 58 is pulled to a high level. When node 58 reaches the trigger level of NAND gate 56 (approximately 1 volt) the supervoltage SV will go high. The voltage on the external address pin, therefore, triggered the supervoltage at 6.8 volts.

The supervoltage reference circuit 30 adjusts the reference voltage accordingly when the memory device is operating in a burn-in test mode. The memory device illustrated is designed to be tolerant of voltages up to 6 volts. Thus the address pin A7 is shown in FIGS. 3 and 4 as starting at a 6 volt level. The external supervoltage must be above this tolerance voltage to avoid accidental activation of the supervoltage detection circuit. It will be understood that any reference level can be used and is not limited to the levels described herein. Further, similar detection circuitry can be provided to more address pins to provide greater flexibility during testing.

Conclusion

An integrated memory circuit has been described which can be tested in both a burn-in mode and application specific test mode. By applying a supervoltage to one of the memory circuit's external inputs the application specific test mode can be initiated. A circuit has been described which adjusts a supervoltage reference voltage such that when a memory is being tested in a burn-in mode the supervoltage trigger level is reduced to avoid damage to the memory. If a burn-in test is being performed, the reference voltage is reduced from the level used when the memory is not operating in a burn-in test mode. The multi-level reference voltage is provided to the supervoltage detection circuit, thereby, adjusting the supervoltage level needed to initiate an application specific test.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:

an address bus;

an array of memory registers;

a data bus;

a control circuit;

one or more terminals coupled to receive a supply voltage;

a burn-in circuit structured to generate a burn-in signal at a burn-in signal output when the supply voltage is greater than a first threshold voltage;

a reference circuit having an input coupled to the burn-in signal output to receive the burn-in signal and a terminal coupled to receive the supply voltage, the reference circuit being structured to generate a reference signal at a reference signal output, the reference signal being less than the supply voltage when the burn-in signal is being generated and substantially equal to the supply voltage when the burn-in signal is not being generated;

a detection circuit having an external input coupled to receive a voltage, a reference input coupled to the reference signal output to receive the reference signal, and an output, the detection circuit being structured to generate a detection signal at the output of the detection circuit when the voltage at the external input is greater than the reference signal by a second threshold voltage.

2. The memory device of claim 1 wherein the reference circuit further comprises:

a pull-up transistor coupled between the reference signal output and the supply voltage and having a control terminal coupled to the burn-in signal output, the pull-up transistor being activated to couple the supply voltage to the reference signal output when the burn-in signal is not being generated;

at least one feedback transistor; and wherein the reference circuit is structured to generate the reference signal to be approximately one-half of the supply voltage when the burn-in signal is being generated.

3. An integrated circuit comprising:

a burn-in circuit structured to generate a burn-in signal at a burn-in signal output when the integrated circuit is operating in a burn-in mode;

a reference circuit having an input coupled to the burn-in signal output and structured to receive the burn-in signal, the reference circuit being structured to generate a reference signal at a reference signal output based on the burn-in signal;

an external input structured to receive a voltage;

a supervoltage detection circuit comprising a transistor having a first terminal coupled to the external input, a control terminal coupled to the reference signal output to receive the reference signal, and a second terminal coupled to an output terminal, the supervoltage detection circuit being structured to generate a test signal at the output terminal when the voltage at the external input is greater than the reference signal by a first threshold voltage and the transistor is activated.

4. The integrated circuit of claim 3, wherein the super-voltage detection circuit further comprises:

a scale-down circuit coupled between the external input and the first terminal of the transistor, the scale-down circuit being structured to reduce the voltage at the external input to generate a reduced voltage at the first terminal of the transistor;

a logic circuit coupled between the second terminal of the transistor and the output terminal, the logic circuit having an input structured to receive a power-up signal during a power up procedure, the logic circuit being structured to relay the test signal from the second terminal of the transistor to the output terminal when the power-up signal is not received and to latch the output terminal when the power-up signal is received; and wherein the burn-in circuit is structured to generate the burn-in signal when the integrated circuit is receiving a supply voltage greater than a second threshold voltage or the integrated circuit is operating at a temperature greater than a threshold temperature;

the reference circuit comprises a pull-up transistor connected between the supply voltage and the reference signal output and at least one feedback transistor; and the external input comprises a terminal of an address bus and the integrated circuit comprises a DRAM.

5. An integrated circuit comprising:

a mode circuit structured to generate a mode signal at an output according to operating conditions of the integrated circuit;

a reference circuit having an input coupled to the output of the mode circuit and being structured to receive the mode signal, the reference circuit being structured to generate a reference signal at a reference signal output based on the mode signal;

an external input structured to receive a voltage;

a detection circuit having a first input coupled to the external input, a second input coupled to the reference signal output to receive the reference signal, and an output, the detection circuit being structured to generate a detection signal when the voltage at the external input is greater than the reference signal.

6. The integrated circuit of claim 5 wherein:

the mode circuit is structured to generate the mode signal to indicate that the integrated circuit is operating under burn-in conditions when the integrated circuit is receiving a supply voltage greater than a first threshold voltage or the integrated circuit is operating at a temperature greater than a threshold temperature;

the reference circuit comprises a pull-up transistor connected between the supply voltage and the reference signal output and at least one feedback transistor, the reference circuit being structured to generate the reference signal to be less than the supply voltage when the mode signal indicates burn-in conditions and to be substantially equal to the supply voltage when the mode signal does not indicate burn-in conditions; and the external input comprises a terminal of an address bus and the integrated circuit comprises a DRAM.

7. The integrated circuit of claim 5 wherein the detection circuit further comprises:

a scale-down circuit coupled to the external input and structured to reduce the voltage at the external input to generate a reduced voltage;

a transistor having a first terminal coupled to the scale-down circuit to receive the reduced voltage, a control terminal coupled to the reference signal output to receive the reference signal, and a second terminal coupled to the output of the detection circuit, the transistor being activated when the reduced voltage is greater than the reference signal by a second threshold voltage to generate the detection signal at the output of the detection circuit; and a logic circuit coupled between the second terminal of the transistor and the output of the detection circuit, the logic circuit having a power-up signal input structured to receive a power-up signal during a power up procedure, the logic circuit being structured to relay the detection signal from the second terminal of the transistor to the output of the detection circuit and to latch the output of the detection circuit when the power-up signal is received.

8. A memory device comprising:

an address bus;

an array of memory registers;

a data bus;

a control circuit;

one or more terminals coupled to receive a supply voltage;

a burn-in circuit structured to generate a burn-in signal at an output when the supply voltage is greater than a first threshold voltage;

means for receiving the burn-in signal and generating a reference signal based on the burn-in signal, the reference signal being approximately one-half of the supply voltage when the burn-in signal is being generated and being approximately equal to the supply voltage when the burn-in signal is not being generated;

an external input structured to receive a voltage; and a detection circuit structured to detect a supervoltage at the external input when the voltage at the external input is greater than the reference signal by a second threshold voltage and to generate a detection signal when the supervoltage is detected.

9. A method for detecting a supervoltage applied to an external terminal of an integrated circuit, the integrated circuit being coupled to receive a supply voltage, the method comprising:

generating a mode signal indicating an operating condition of the integrated circuit;

generating a reference signal having a voltage determined by the mode signal;

comparing a voltage applied to the external terminal with the reference signal; and detecting the supervoltage and generating a detection signal when the voltage applied to the external terminal is greater than the reference signal by a first threshold voltage.

10. The method of claim 9 wherein generating a mode signal comprises generating a mode signal indicating a production burn-in operation of the integrated circuit.

11. The method of claim 9 wherein generating a mode signal comprises:

monitoring the supply voltage or an operating temperature of the integrated circuit;

generating a mode signal with a first voltage when the supply voltage is less than a second threshold voltage or the operating temperature is below a threshold temperature to indicate a normal operating mode of the integrated circuit;

generating the mode signal with a second voltage when the supply voltage is greater than the second threshold voltage or the operating temperature is greater than the threshold temperature to indicate a burn-in operating mode.

12. The method of claim 11 wherein generating a reference signal comprises:

generating a reference signal to be approximately equal to the supply voltage when the mode signal has the first voltage; and generating the reference signal to be approximately equal to one-half of the supply voltage when the mode signal has the second voltage.

13. A method for initiating a test of a memory device, the method comprising:

coupling a supply voltage to the memory device;

monitoring the supply voltage;

generating a reference signal based on the supply voltage;

reducing the reference signal when the supply voltage is greater than a first threshold voltage;

coupling a voltage to an external terminal of the memory device;

comparing the reference signal to the voltage at the external terminal; and initiating the test of the memory device by generating a test signal when the voltage at the external terminal is greater than the reference signal.

14. The method of claim 13 wherein:

generating a reference signal comprises generating a reference signal to be approximately equal to the supply voltage and reducing the reference signal comprises reducing the reference signal to be approximately one-half of the supply voltage when the supply voltage is greater than the first threshold voltage; and further comprising generating a burn-in signal when the supply voltage is greater than the first threshold voltage to indicate that the memory device is to be tested under burn-in conditions.

15. The method of claim 13, further comprising:

reducing the voltage at the external terminal;

generating a power-up signal in the memory device during a power up procedure; and preventing the generation of the test signal when the power-up signal is being generated.

16. A method for operating an integrated circuit, the method comprising:

coupling a supply voltage to one or more terminals of the integrated circuit;

monitoring the supply voltage with a burn-in circuit;

generating a burn-in signal in the burn-in circuit based on the supply voltage, the burn-in signal having a first voltage level when the supply voltage is less than a first threshold voltage and having a second voltage level when the supply voltage is greater than the first threshold voltage;

coupling the burn-in signal to an input of a reference circuit;

generating a reference signal at an output of the reference circuit when the burn-in signal has the first voltage level;

reducing the reference signal when the burn-in signal has the second voltage level;

coupling the reference signal to a detection circuit;

coupling a voltage to an external terminal of the integrated circuit, the external terminal being coupled to the detection circuit;

comparing the reference signal with the voltage at the external terminal in the detection circuit; and initiating a test of the integrated circuit by generating a detection signal at an output terminal of the detection circuit when the voltage at the external terminal is greater than the reference signal.

17. The method of claim 16, further comprising:

reducing the voltage at the external terminal in a scale-down circuit coupled between the external terminal and the detection circuit to generate a reduced voltage; and wherein generating a reference signal comprises generating a reference signal at an output of the reference circuit to be approximately equal to the supply voltage when the burn-in signal has the first voltage level;

reducing the reference signal comprises reducing the reference signal to be approximately equal to one-half the supply voltage when the burn-in signal has the second voltage level;

comparing the reference signal comprises comparing the reference signal with the reduced voltage in the detection circuit; and initiating a test comprises initiating a test of the integrated circuit by generating a detection signal at an output terminal of the detection circuit when the reduced voltage is greater than the reference signal.

18. The method of claim 17 wherein comparing the reference signal comprises:

coupling the reduced voltage to a terminal of a transistor;

coupling the reference signal to a control terminal of the transistor;

activating the transistor when the reduced voltage is greater than the reference signal by a threshold voltage of the transistor; and wherein initiating the test further comprises initiating the test when the transistor is activated.

19. The method of claim 16, further comprising:

generating a power-up signal in the integrated circuit during a power up procedure;

coupling the power-up signal to the detection circuit; and preventing the generation of the detection signal when the power-up signal is being generated.

20. A method for operating a memory device, the memory device including an address bus, an array of memory registers, a data bus, and a control circuit, the method comprising:

coupling a supply voltage to one or more terminals of the memory device;

providing control signals to the memory device from a microprocessor;

providing row and column addresses to the memory device over the address bus to select a memory register;

providing data to the memory device and receiving data from the memory device over the data bus;

monitoring the supply voltage;

generating a reference signal based on the supply voltage;

reducing the reference signal when the supply voltage is greater than a first threshold voltage;

coupling a voltage to an external terminal of the memory device;

comparing the reference signal with the voltage at the external terminal; and initiating a test of the memory device by generating a test signal when the voltage at the external terminal is greater than the reference signal.

21. The method of claim 20 wherein:

generating a reference signal comprises generating a reference signal to be approximately equal to the supply voltage;

reducing the reference signal comprises reducing the reference signal to be approximately one-half of the supply voltage when the supply voltage is greater than a first threshold voltage; and further comprising generating a burn-in signal when the supply voltage is greater than the first threshold voltage to indicate that the memory device is to be tested under a burn-in condition.

22. The method of claim 20, further comprising:

reducing the voltage at the external terminal;

generating a power-up signal in the memory device during a power up procedure; and preventing a generation of the test signal when the power-up signal is being generated.

23. A method for operating a memory device, the memory device including an address bus, an array of memory registers, a data bus, and a control circuit, the method comprising:

coupling a supply voltage to one or more terminals of the memory device;

providing control signals to the memory device from a microprocessor;

providing row and column addresses to the memory device over the address bus to select a memory register;

providing data to the memory device and receiving data from the memory device over the data bus;

monitoring the supply voltage with a burn-in circuit;

generating a burn-in signal in the burn-in circuit based on the supply voltage, the burn-in signal having a first voltage level when the supply voltage is less than a first threshold voltage and having a second voltage level when the supply voltage is greater than the first threshold voltage;

coupling the burn-in signal to an input of a reference circuit;

generating a reference signal at an output of the reference circuit;

reducing the reference signal when the burn-in signal has the second voltage level;

coupling the reference signal to a detection circuit;

coupling a voltage to an external terminal of the memory device, the external terminal being coupled to the detection circuit;

comparing the reference signal to the voltage at the external terminal in the detection circuit; and initiating a test of the memory device by generating a test signal at an output terminal of the detection circuit when the voltage at the external terminal is greater than the reference signal.

24. The method of claim 23, further comprising:

reducing the voltage at the external terminal in a scale-down circuit coupled between the external terminal and the detection circuit to generate a reduced voltage; and wherein generating a reference signal comprises generating a reference signal at an output of the reference circuit to be approximately equal to the supply voltage when the burn-in signal has the first voltage level;

reducing the reference signal comprises reducing the reference signal to be approximately equal to one-half the supply voltage when the burn-in signal has the second voltage level;

comparing the reference signal comprises comparing the reference signal to the reduced voltage in the detection circuit; and initiating a test comprises initiating a test of the memory device by generating a test signal at an output terminal of the detection circuit when the reduced voltage is greater than the reference signal.

25. The method of claim 24 wherein the step of comparing the reference signal comprises:

coupling the reduced voltage to a terminal of a transistor;

coupling the reference signal to a control terminal of the transistor;

activating the transistor when the reduced voltage is greater than the reference signal by a threshold voltage of the transistor; and wherein the step of initiating a test further comprises initiating the test when the transistor is activated.

26. The method of claim 23, further comprising:

generating a power-up signal in the memory device during a power up procedure;

coupling the power-up signal to the detection circuit; and preventing the generation of the test signal when the power-up signal is being generated.

27. A method for initiating a test of an integrated circuit, the method comprising:

coupling a supply voltage to the integrated circuit;

operating the integrated circuit in a first mode under first operating conditions;

operating the integrated circuit in a second mode under second operating conditions;

generating a reference signal having a first voltage level when the integrated circuit is operated in the first mode and having a second voltage level when the integrated circuit is operated in the a second mode;

coupling a voltage to an external terminal of the integrated circuit;

comparing the reference signal to the voltage at the external terminal; and initiating the test of the integrated circuit by generating a test signal when the voltage at the external terminal is greater than the reference signal.

28. The method of claim 27 wherein:

the integrated circuit comprises a memory device;

operating the integrated circuit in a first mode comprises operating the integrated circuit in a first mode when the supply voltage is less than a threshold voltage;

operating the integrated circuit in a second mode comprises operating the integrated circuit in a second mode when the supply voltage is greater than the threshold voltage; and generating a reference signal comprises generating a reference signal to be approximately equal to the supply voltage when the supply voltage is less than the threshold voltage and generating the reference signal to be approximately one-half of the supply voltage when the supply voltage is greater than the threshold voltage.

29. The method of claim 27, further comprising:

reducing the voltage at the external terminal;

generating a power-up signal in the integrated circuit during a power up procedure; and preventing the generation of the test signal when the power-up signal is being generated.

* * * * *